US 6,593,066 B2

(12) United States Patent
Cabiri et al.

(10) Patent No.: US 6,593,066 B2
(45) Date of Patent: Jul. 15, 2003

(54) METHOD AND APPARATUS FOR PRINTING PATTERNS ON SUBSTRATES

(75) Inventors: Oz Cabiri, Macabim (IL); Hai Benron, Haifa (IL)

(73) Assignee: Creo IL. Ltd., Herzlia Pituach (IL)

( * ) Notice: Subject to any disclaimer, the term of this patent is extended or adjusted under 35 U.S.C. 154(b) by 119 days.

(21) Appl. No.: 09/793,981

(22) Filed: Feb. 28, 2001

(65) Prior Publication Data

US 2002/0118345 A1 Aug. 29, 2002

(51) Int. Cl.⁷ .................................................. G03F 7/20
(52) U.S. Cl. ........................ 430/319; 430/322; 430/945
(58) Field of Search ........................... 430/319, 322, 430/323, 325, 945, 311, 312, 318; 355/53

(56) References Cited

U.S. PATENT DOCUMENTS

| | | |
|---|---|---|
| 3,646,336 A | 2/1972 | Hobrough |
| 4,790,694 A | 12/1988 | Wilent et al. |
| 4,829,375 A | 5/1989 | Alzmann et al. |
| 4,999,764 A | 3/1991 | Ainsworth et al. |
| 5,036,574 A | 8/1991 | Kakimoto |
| 5,124,927 A | 6/1992 | Hopewell et al. |
| 5,136,948 A | 8/1992 | Fujino et al. |
| 5,164,742 A | 11/1992 | Baek et al. |
| 5,200,800 A | 4/1993 | Suda et al. |
| 5,230,027 A | 7/1993 | Kikuchi |
| 5,274,394 A | 12/1993 | Corona et al. |
| 5,381,004 A | 1/1995 | Uritsky |
| 5,403,684 A | 4/1995 | Schroeder et al. |
| 5,453,777 A | 9/1995 | Pensavecchia |
| 5,459,941 A | 10/1995 | Lowe |
| 5,500,801 A | 3/1996 | Loffler |
| 5,506,793 A | 4/1996 | Straayer et al. |
| 5,548,372 A | 8/1996 | Schroeder et al. |
| 5,682,243 A | 10/1997 | Nishi |
| 5,699,742 A | 12/1997 | Ahrens et al. |
| 5,754,294 A | 5/1998 | Jones et al. |
| 5,812,407 A | 9/1998 | Sato et al. |
| 5,835,194 A | 11/1998 | Morton |
| 5,894,350 A | 4/1999 | Hsieh et al. |
| 5,920,481 A | 7/1999 | Ichihara et al. |
| 5,980,088 A | 11/1999 | Iwasaki et al. |
| 5,980,194 A | 11/1999 | Freerks et al. |
| 5,985,680 A | 11/1999 | Singhal et al. |
| 6,043,865 A | 3/2000 | Halup et al. |
| 6,205,364 B1 | 3/2001 | Lichtenstein et al. |

FOREIGN PATENT DOCUMENTS

JP    61-102651 A    *    5/1987

OTHER PUBLICATIONS

Laser Direct Imaging for Precise Positioning of Circuitry with HDI/MicroVias and SBU Technologies, Guenther Enne, et al, TPCA 2000 Forum Proceedings, Nov. 23–25, 2000, pp. 377–384.

* cited by examiner

Primary Examiner—John A. McPherson
(74) Attorney, Agent, or Firm—G. E. Ehrlich (1995) Ltd.

(57) ABSTRACT

A method and apparatus for printing a pattern on a substrate, by applying a photoresist layer over the substrate; locating a laser direct-imagining exposure head to print the pattern on the substrate by the application of one or more laser beams to the photoresist layer on the substrate while relative movement is effected between the exposure head and the substrate; and controlling the drive and the exposure head to cause the exposure head to print a first portion of the pattern on a first portion of the substrate at a first (normal) resolution, and a second portion of the pattern on a second portion of the substrate at a second (higher) resolution.

17 Claims, 8 Drawing Sheets

METHOD AND APPARATUS FOR PRINTING PATTERNS ON SUBSTRATES

FIELD AND BACKGROUND OF THE INVENTION

The present invention relates to methods and apparatus for printing patterns on substrates. The invention is particularly useful for printing patterns (conductive or non-conductive) on panels in the manufacture of Electronics Components (ELC), Flat Panel Displays (FPD), various conductive and non-conductive patterns or holes on/in PCBs, masks for soldering, plating, etching or plasma etching and multi-layer printed circuit boards (PCBs). It is described below with respect to this last application merely for purposes of example.

PCBs (sometimes referred to as PWBs, or printed wiring boards) are widely used in electronic systems. Such PCBs may include as many as 20 or 30 layers, each having its own electrically conductive pattern layers as well as non-conductive layers, with various layers electrically connected together by interlayer connections, such as pins, posts, plated-through-holes (PTHs), pads and the like. Because of the interrelationship between the patterns in the various layers, a relatively high degree of resolution (i.e., the smallest incremental step in separating a measurement in its constituent parts) is required in printing the patterns; and because of the large number of layers in a PCB, a relatively high rate of throughput is required for a commercially usable method.

However, the throughput of a manufacturing process is inversely related in a non-linear manner to the required resolution. Thus, if the resolution is doubled, the time required for producing the respective layer is multiplied approximately by four. Therefore, the existing manufacturing processes for producing PCBs require engineering compromises that can significantly affect the resolution and/or the throughput.

OBJECTS AND BRIEF SUMMARY OF THE PRESENT INVENTION

An object of the present invention is to provide a method, and also an apparatus, for printing a pattern on a substrate enabling higher resolution, without unduly reducing throughput where high resolution is needed. Another object of the present invention is to provide a method and apparatus for printing patterns particularly useful in the production of multi-layer PCBs.

According to one aspect of the present invention, there is provided a method of printing a pattern on a substrate, comprising: applying a photoresist layer over the substrate; locating a laser direct-imaging exposure head with respect to the substrate to print the pattern on the substrate by the application of laser energy to the photoresist layer on the substrate while relative movement is effected between the exposure head and the substrate by a drive; defining a first portion of the substrate to be printed with a first portion of the pattern at a first resolution, and a second portion of the substrate to be printed with a second portion of the pattern at a second, higher resolution; and controlling the drive and the exposure head to cause the exposure head to print the first portion of the pattern on the first portion of the substrate at the first resolution, and the second portion of the pattern on the second portion of the substrate at the second, higher resolution.

In the preferred embodiments of the invention described below, the photoresist layer applied over the substrate is a bi-state photoresist material which assumes a non-exposed state up to a predetermined exposure threshold, an exposed state at the predetermined exposure threshold, and remains in the exposed state beyond the predetermined exposure threshold, being insensitive to further exposure beyond the predetermined exposure threshold.

According to further features in the described preferred embodiments, the second portion of the substrate to be printed at the second, higher resolution is defined by specifying the borders of the second portion of the pattern, while the remainder of the substrate is defined as the first portion of the substrate to be printed with the first portion of the pattern at the first resolution.

According to still further features in the described preferred embodiments, the drive and the exposure head are controlled such that smaller increments of movement are effected by the drive between the exposure head and the substrate while the exposure head is printing the second portion of the pattern at the second, higher resolution than while the exposure head is printing the first portion of the pattern at the first resolution.

In one described preferred embodiment, the drive and the exposure head are controlled to cause the exposure head to print the first portion of the pattern on the first portion of the substrate at the first resolution, and the second portion of the pattern on the second portion of the substrate at the second, higher resolution, both during a single scan of the exposure head with respect to the substrate.

In a second described preferred embodiment, the drive and the exposure head are controlled to cause the exposure head to print the first and second portions of the pattern on the first and second portions of the substrate at the first resolution during a first scan of the exposure head with respect to the substrate; and then to print only the second portion of the pattern on the second portion of the substrate at the second, higher resolution during a second scan of the exposure head with respect to the substrate.

According to further features in the described preferred embodiments, the drive includes a first motor and transmission which moves the substrate with respect to the exposure head along the longitudinal axis of the substrate, and a second motor and transmission which moves the exposure head with respect to the substrate along the transverse axis of the substrate; the first motor and transmission being controlled to move the substrate through smaller increments of distance when the exposure head is printing the second portion of the pattern at the second, higher resolution, than when printing the first portion of the pattern at the first resolution.

In one described preferred embodiment, the exposure head includes a linear array of lasers extending in the direction of the longitudinal axis of the substrate, the lasers being selectively controlled to print at the first resolution or the second higher resolution during the transverse movement of the exposure head with respect to the substrate.

In a second described embodiment, the exposure head includes a laser producing a laser beam, and a rotating polygonal mirror for reflecting the laser beam in the direction of the longitudinal axis; the laser beam being selectively controlled with respect to the mirror to print at the first resolution or the second, higher resolution during the transverse movement of the exposure head with respect to the substrate.

According to another aspect of the present invention, there is provided apparatus for printing a pattern on a photoresist layer carried by a substrate, comprising: a holder for carrying the substrate; a laser direct-imaging exposure head mounted with respect to the holder to print the pattern on the photoresist layer of the substrate when the substrate is carried by the holder; a drive for effecting relative movement between the exposure head and the substrate; and a controller programmed to enable: defining a first portion of the substrate to be printed with a first portion of the pattern at a first resolution, and a second portion of the substrate to be printed with a second portion of the pattern at a second, higher resolution; and controlling the drive and the exposure head to cause the exposure head to print the first portion of the pattern on the first portion of the substrate at the first resolution, and the second portion of the pattern on the second portion of the substrate at the second, higher resolution.

As will be described more particularly below, such a method and apparatus enable the printing of patterns on substrates at a relatively high resolution as and where needed without unduly reducing the throughput and thereby makes the method and apparatus particularly useful for producing multi-layer PCBs. Thus, in most cases, the PCBs include only relatively small portions of a pattern which require higher resolution than other portions, and/or only certain layers having portions requiring the higher resolution. By using the method of the present invention, the manufacturing process is slowed-down only with respect to those layer portions requiring the higher resolution, and therefore the overall throughput of the process is not reduced anywhere near the extent it would be if a complete layer, or all the layers of a PCB, were to be printed at the higher resolution.

While the preferred embodiment of the invention described below describes selecting two resolutions (e.g., a normal resolution and a higher resolution), it will be appreciated that the method and apparatus could also be used for selecting more than two resolutions (e.g., a normal resolution, a higher resolution, and an ultra-high resolution) according to the particular application, thereby enabling printing patterns at the optimum resolution for each pattern without unduly reducing the overall throughput of the process.

Further features and advantages of the invention will be apparent from the description below.

BRIEF DESCRIPTION OF THE DRAWINGS

The invention is herein described, by way of example only, with reference to the accompanying drawings, wherein.

DESCRIPTION OF PREFERRED EMBODIMENTS

Figure 1:
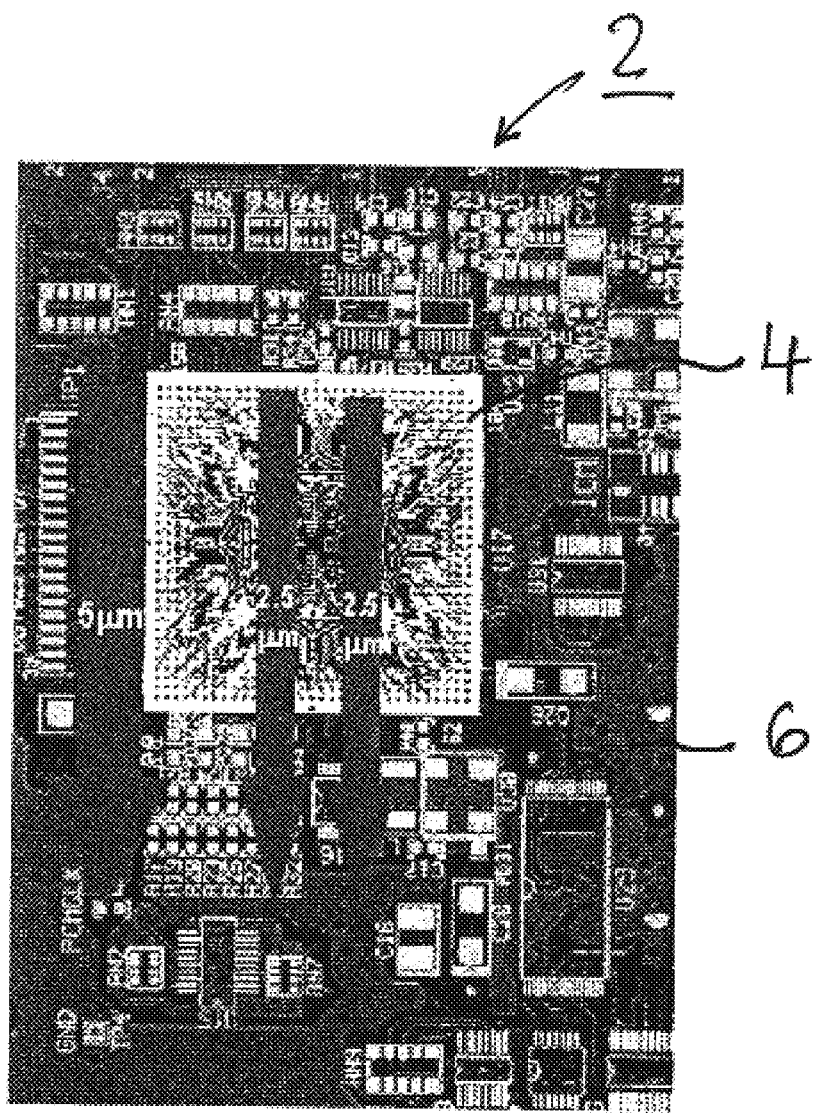
FIG. 1 illustrates the outer layer of PCB particularly suitable for production in accordance with the present invention since it includes portions requiring a normal (which may be a high) resolution, and other portions requiring an even higher resolution.

FIG. 1 illustrates a printed circuit board PCB, generally designated 2, in which the outer layer seen in FIG. 1 includes a conductive pattern which could also be a non-conductive pattern having a portion, generally designated 4, requiring a higher resolution than the remainder of the pattern, generally designated 6. For example, the central high-resolution central portion 4 may be designed to receive a high-density integrated-circuit chip and may therefore require a resolution of 2.5 $\mu$m; whereas the remainder 6 of the conductive pattern may be designed to receive various types of other electrical components in which a lower resolution of 5 $\mu$m may be sufficient.

In making such types of PCBs, the conventional practice is to design the printing process to meet the highest-resolution requirements for the respective PCB. However, as indicated earlier, the result is to increase the processing time for the respective PCB, and thereby reduce the throughput of the process, to an inordinate degree since the throughput varies approximately inversely to the square of the resolution.

As will be described more particularly below, the present invention controls the printing of the pattern shown in FIG. 1 to tailor the printing on the respective PCB according to the resolution required for the respective portion of the PCB. Thus, since the relatively small pattern portion 4 requires the high resolution, only that portion will be printed with high resolution, whereas the remainder 6 of the pattern will be printed at the lower resolution, thereby substantially reducing the overall time for producing the complete pattern, and substantially increasing the throughput of the process.

Particularly good results are obtainable when the photoresist layer applied over the substrate is a bi-state photoresist material which assumes a non-exposed state up to a predetermined exposure threshold, an exposed state at the predetermined exposure threshold, and remains in the exposed state, being thereafter insensitive to exposure beyond the predetermined exposure threshold. A preferred photoresist material is that supplied by Creo Products Inc., of Israel.

As will be described more particularly below, the portion of the substrate to be printed at the second, (higher) resolution is defined by specifying the borders of that portion of the pattern, while the remainder of the substrate is defined as the portion to be printed at the first (normal) resolution.

Figure 2:
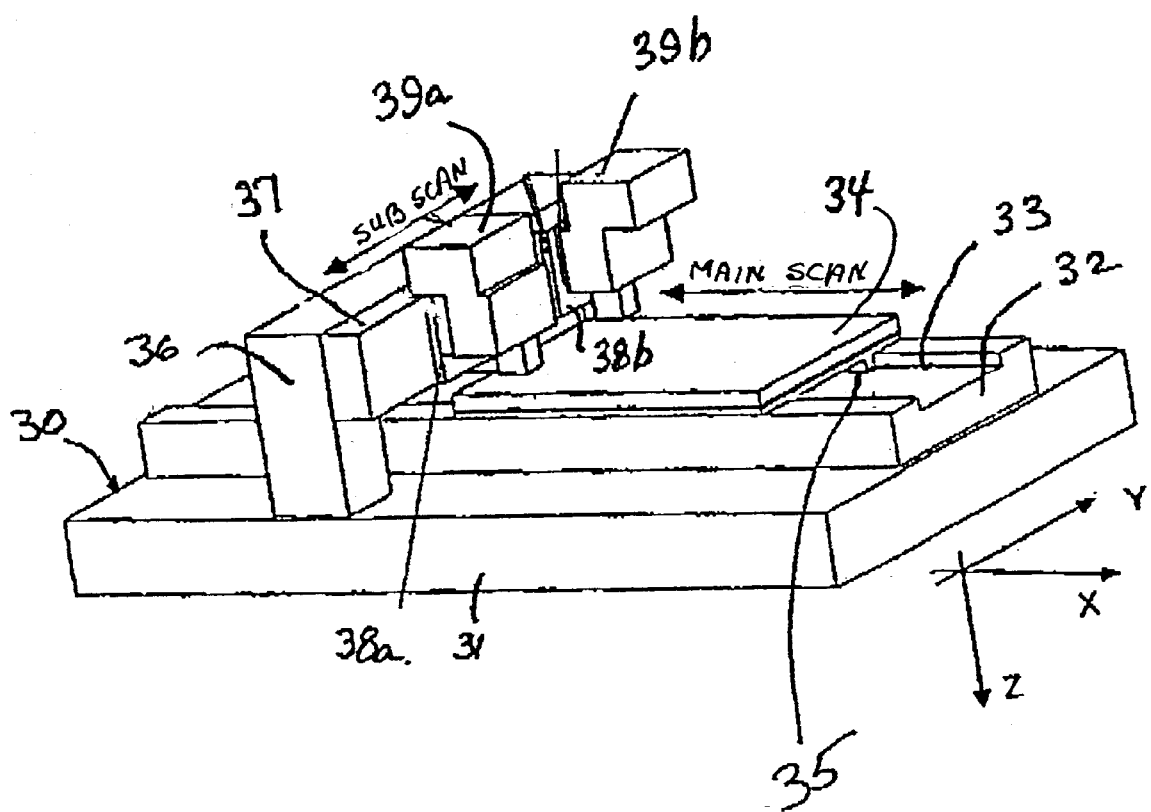
FIG. 2 illustrates one form of apparatus that may be used for performing the method of the present invention for producing PCBs.

FIG. 2 illustrates one form of apparatus that may be used for practicing the novel method. The illustrated apparatus includes a granite base 31 formed with a table 32 having a longitudinal guideway 33 extending along the longitudinal axis of the apparatus, namely the X-axis. The apparatus further includes a chuck 34 for holding the substrate or panel used for making the PCB. Chuck 34 is formed with a pair of parallel ribs 35 on its lower surface movable within guideway 33 for guiding the movement of the chuck, and thereby of the panel held thereon, for longitudinal movement along the X-axis.

The illustrated apparatus further includes a bridge 36 supported on the granite base 31 and extending transversely across the table 32 and the chuck 34. A mounting member 37 is secured to the upper portion of the bridge 36 and mounts two slides 38, 38b, each carrying an exposure head 39a, 39b, over the chuck 34, and the panel (not shown) carried by the chuck. Each of the exposure heads 39a, 39b is movable in the Y-axis, namely transversely of the chuck 34 and the panel carried thereby, and also along the Z-axis, namely towards and away from the chuck and the panel carried thereby.

Figure 3:
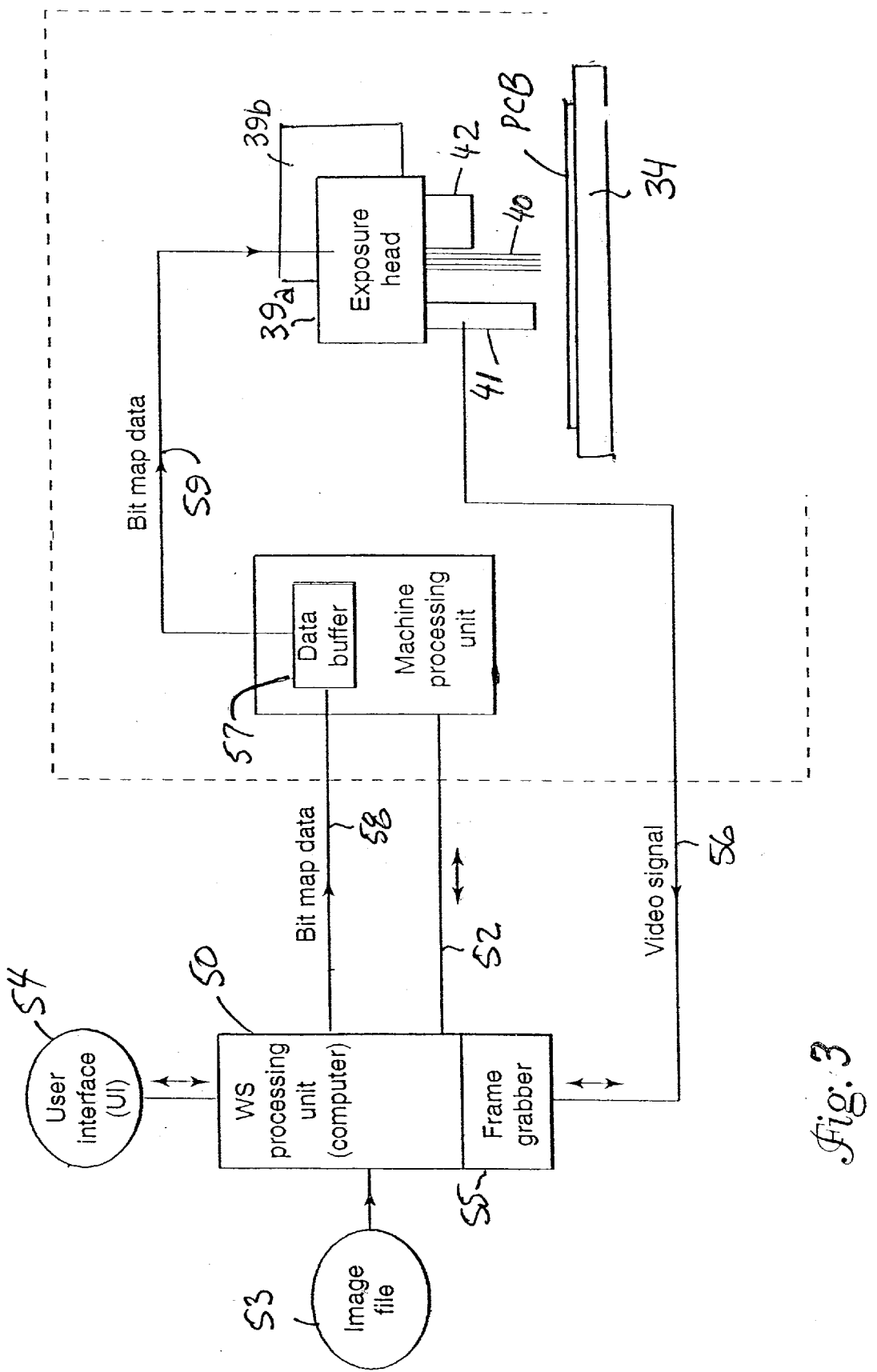
FIG. 3 is a block diagram illustrating the construction of each exposure head and the electronic system used with the apparatus of FIG. 2.

FIG. 3 schematically illustrates the structure of each of the exposure heads 39a, 39b. Thus, the exposure head shown in FIG. 3, and therein designated 39, includes a linear array of lasers 40, defining individually controlled pixels of the image to be printed on the PCB supported on chuck 34.

An electronic camera 41 is fixed to the exposure head 39 so that it moves with it. Camera 41 has a field of view which covers only a relatively small portion of the surface of the panel PCB in order to provide high resolution in a relatively compact camera. The camera is fixed to the exposure head such that a reference point of the camera field of view is at a known location with respect to a reference point of the exposure head, and thereby, of the lasers 40 producing the laser writing beams. Camera 41 is used as a sensing device to snap features on the panel in order to sense reference targets thereon for registration control. Thus, camera 41 senses the actual locations of certain reference targets on the panel PCB in order to determine the deviations thereof with respect to their nominal locations as defined in the respective image file and to correct for such deviations in accordance with known techniques.

Exposure head 39 further carries an autofocus device 42. This device measures the distance between the exposure head and the outer surface of the panel PCB, by means well known in the art, in order to maintain the printing laser beams from the lasers 40 in focus with the outer surface of the panel. Autofocus device 42 may also be used for continuously controlling the lasers 40 to compensate for variations in the thickness of the panel PCB.

As further shown in FIG. 3, the electrical system includes two main processing units: a workstation (WS) processor 50 located in the workstation outside of the imager; and an imager processor 51 located on the imager. The two processors communicate with each other via a two-directional path 52.

WS processor 50 is the main control unit. It receives inputs from the image file 53 and the user interface 54, and controls the lasers 40 and the camera 41 carried by the exposure head 39 in accordance with these inputs. A frame grabber 55 within the WS processor 50 grabs the video signal frame from camera 41 received via line 56, and converts it to a graphic file.

Image processor 51 includes a data buffer 57 which receives the data from the WS processor 50. The WS processor 50 converts the image file 53 to a bit-map file which is sent through a dedicated path 58 to the data buffer 57 of the image processor 51. The latter processor sends the data via a path 59 to the exposure head 39 to control the lasers 40.

Figure 4:
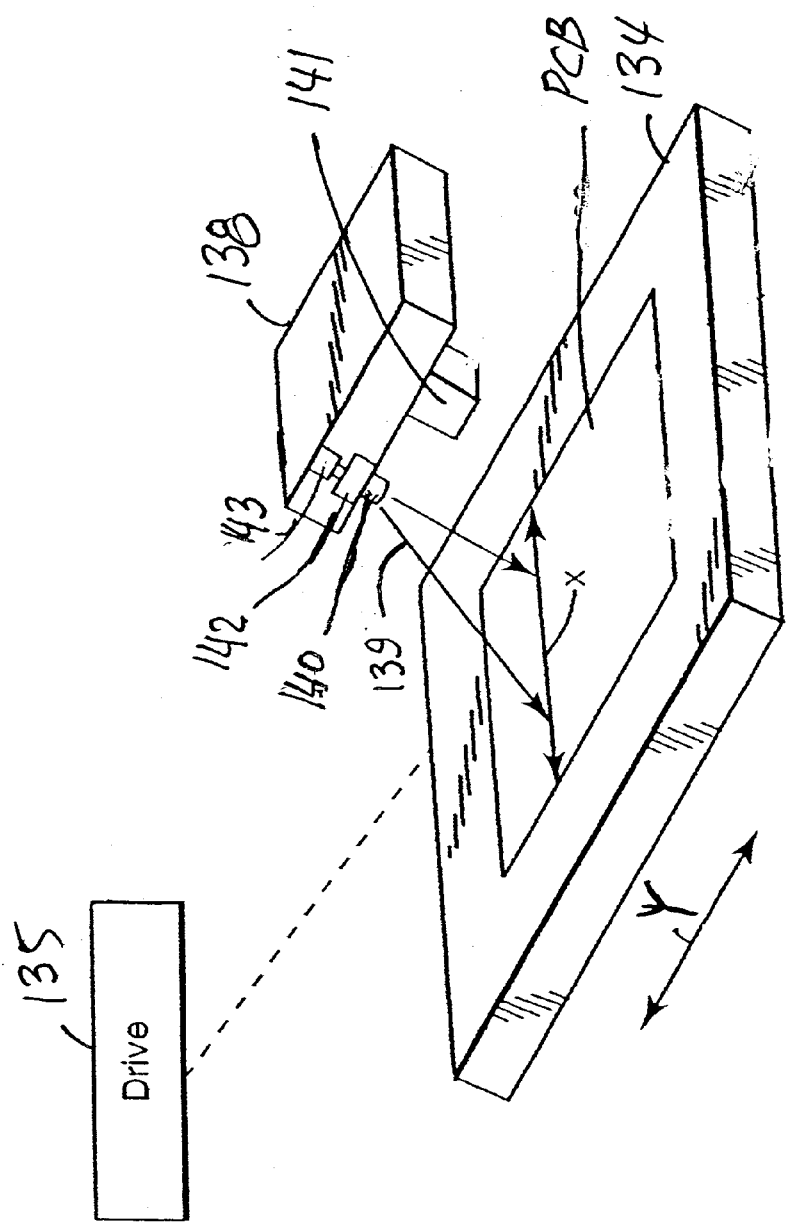
FIG. 4 illustrates another form of apparatus that may be used for producing PCBs in accordance with the present invention.

FIG. 4 illustrates a second type of imaging apparatus that can be used instead of the apparatus illustrated in FIG. 2. The apparatus illustrated in FIG. 4 includes a flat bed 134 for receiving the panel PCB on which an image is to be plotted by one or more lasers carried by an exposure head 138. In this case, the flat bed 134 is driven by a drive 135 along the Y-axis, and the laser beam from the laser 140 is deflected along the X-axis by a rotatable polygonal mirror 143. Exposure head 138 also carries (or is otherwise associated with) a camera 141 and an autofocus device 142 (which may be omitted), corresponding to camera 41 and autofocus 42 in the apparatus of FIG. 2.

Figure 5:
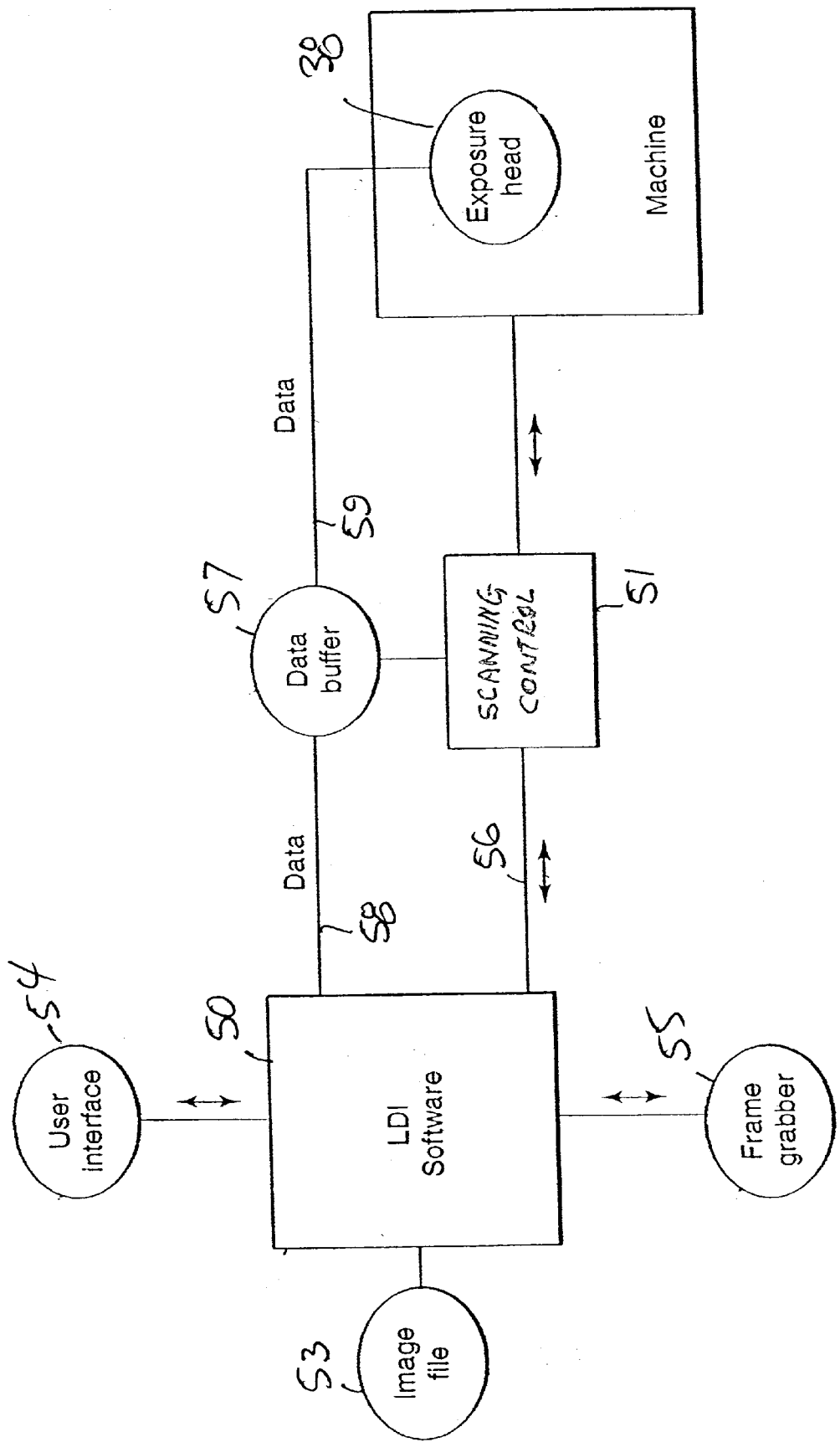
FIG. 5 is a block diagram illustrating the flow of data when using the electronic system of FIG. 4.

FIG. 5 illustrates the flow of the data between the WS workstation processor 50, the imager processor 51, and the exposure head 38 (or 138, FIG. 4). As shown particularly in FIG. 5, the workstation WS operations are governed by the LDI (laser direct imaging) software within the WS processor 50; and the actions of the lasers 40 (or laser 140, FIG. 4) carried by the exposure head 38 (or 138) are governed by the imager processor 51, which processor also receives the feedback from the exposure head.

As indicated earlier, each conductive pattern imaged on the panel PCB is defined by image data derived from the respective image file 53. Such image data is to be applied at their respectively defined locations according to scanning control data which produces relative movement between the exposure head and the PCB along two orthogonal axis to scan the complete surface of the PCB.

In conventional apparatus of this type, the scanning control data causes the exposure head to scan the complete surface of the PCB according to a scanning raster which traces a plurality of straight parallel lines extending transversely of the PCB along the Y-axis, and spaced longitudinally of the PCB along the X-axis. According to one feature of the present invention, such a scanning raster is changed in accordance with the resolution required, such that smaller increments of the scanning movement are effected between the exposure head and the PCB while the exposure head is printing at the higher resolution than while printing at the lower or normal resolution. In addition, the exposure head is correspondingly controlled to print at the high resolution or lower resolution, according to the resolution level specified for the respective portion of the pattern.

Figure 6:
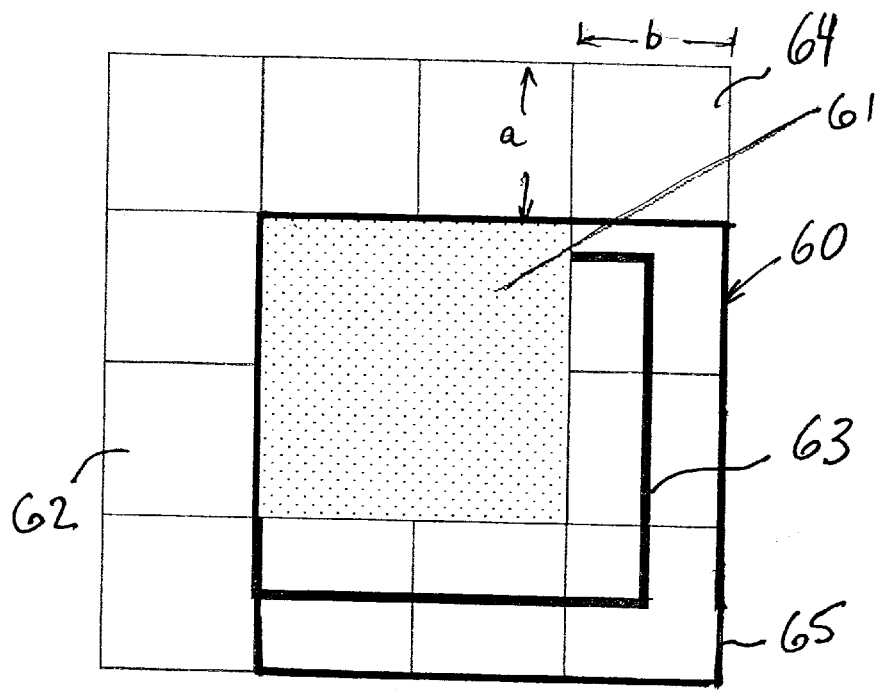
FIGS. 6 and 7 are diagrams helpful in explaining the method of the present invention for obtaining optimum resolution where needed without unduly reducing throughput.

FIG. 6, for example, schematically illustrates a pattern, generally designated 60 to be printed; it includes a portion 61 to be printed at high resolution, and another portion 62 to be printed at the normal or lower resolution. Borderline 63 defines the borders of the high-resolution portion 61.

FIG. 6 illustrates a conventional raster scan in which each pixel element, therein designated 64, is of a relatively large size having the dimensions "a" and "b". Since the borderline 63 of the high resolution portion 61 generally is not coextensive with the borderline of the pixel, but rather overlaps it, with normal resolution, the boundary line 63 would be defined by the pixel element boundary lines 65.

Figure 7:
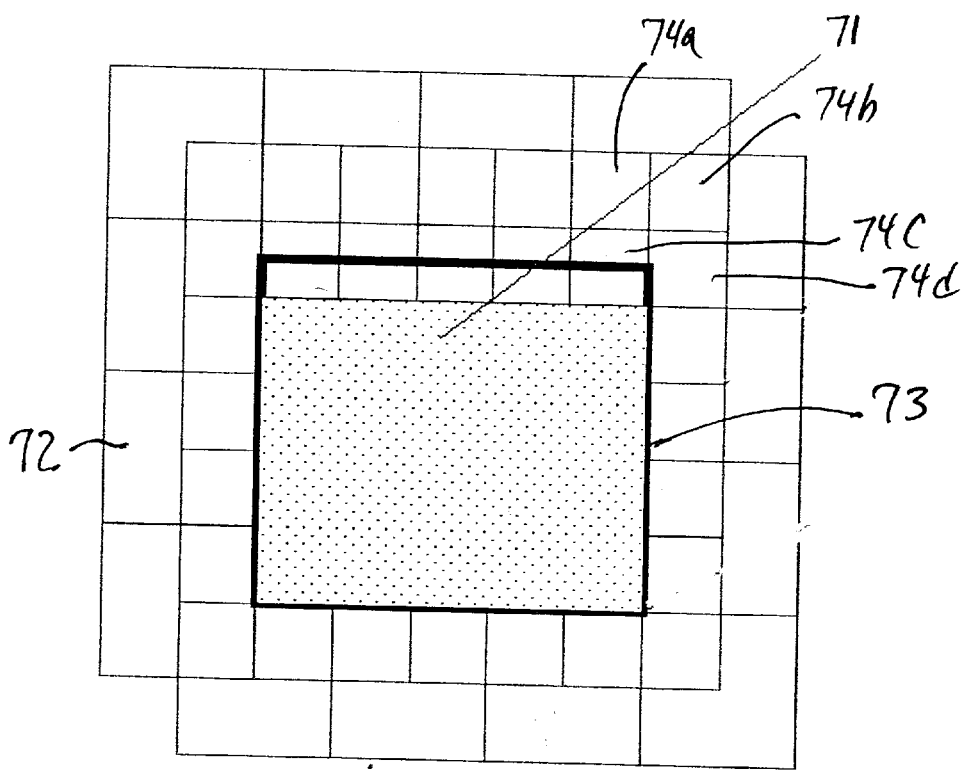

FIG. 7 illustrates the same portion of the pattern to be printed but with higher resolution by introducing half-step smaller increments of movement during the scanning of the exposure head with respect to the substrate. Thus, as known in half-stop scanning techniques for obtaining higher resolution, each pixel element, therein designated 74, is effectively divided into four areas 74a–74d. As a result, the boundary line 73 between the portion 71 of the image requiring high resolution and the portion 72 requiring lower resolution, can be more sharply defined in view of the sub-pixel areas produced as shown at 74a–74d.

While FIGS. 6 and 7 illustrate one manner of providing high resolution whenever needed for a selected portion of the pattern to be printed, it will be appreciated that other techniques for providing high resolution can also be used.

Single-scanning or multiple-scanning processes may be used for printing a pattern having a portion requiring a normal resolution, and another portion requiring a higher resolution.

Figure 8:
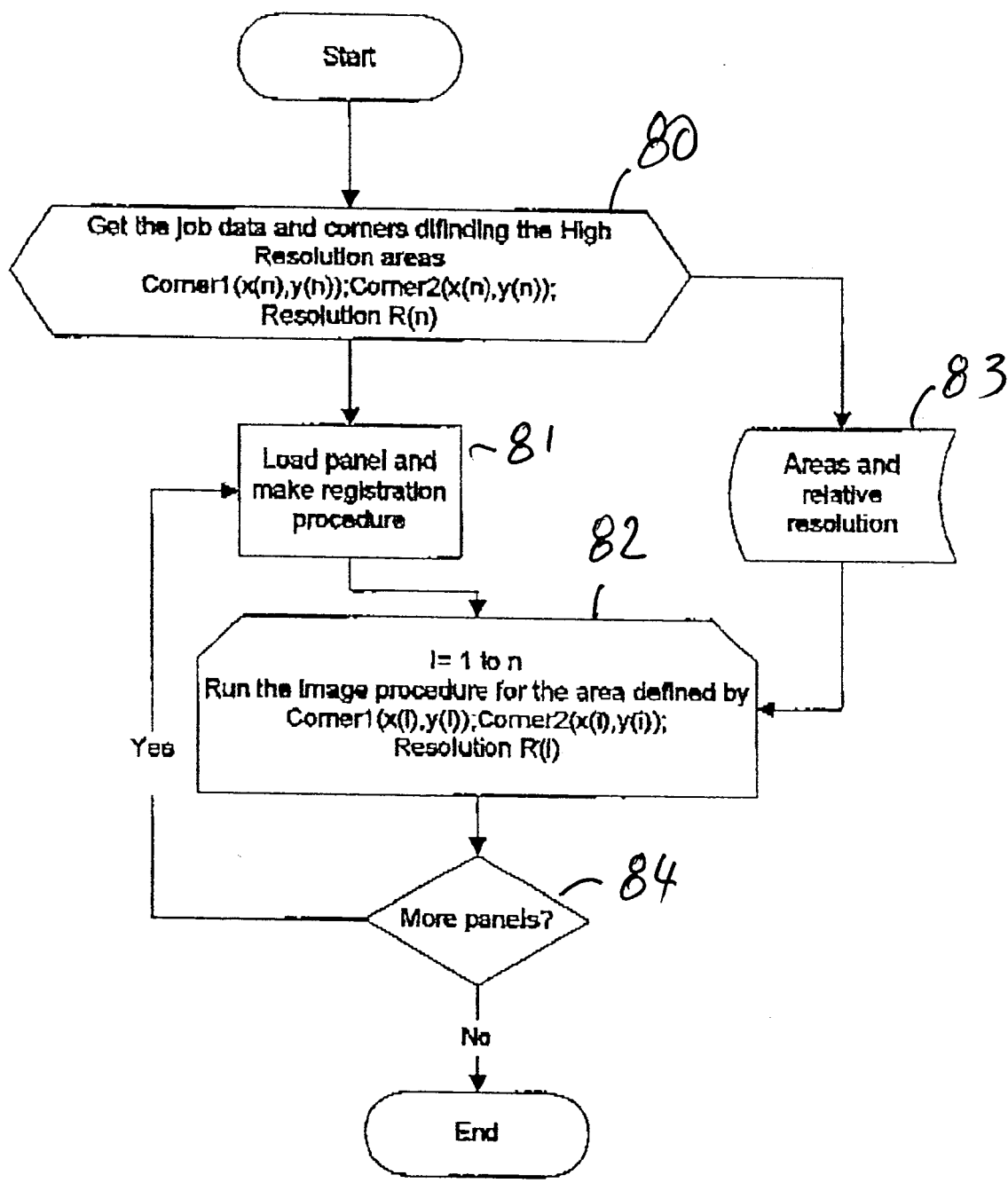
FIG. 8 is a flow chart illustrating one mode of operation of the system.

FIG. 8 illustrates a single-scanning process, in which the scanning drive and the exposure head are controlled to print at the selected resolution for each portion of the pattern during a single scan of the exposure head with respect to the PCB panel. In the process illustrated in FIG. 8, the portions requiring high resolution are defined by their corners (block 80); and the panel is then loaded on the apparatus and properly registered according to known registration procedures (block 81). The panel is then imaged (block 82) according to the predefined resolution requirements for the respective portion of the panel (block 83). Such a one-scan procedure is followed for each pattern to be printed on the panel (block 84).

Figure 9:
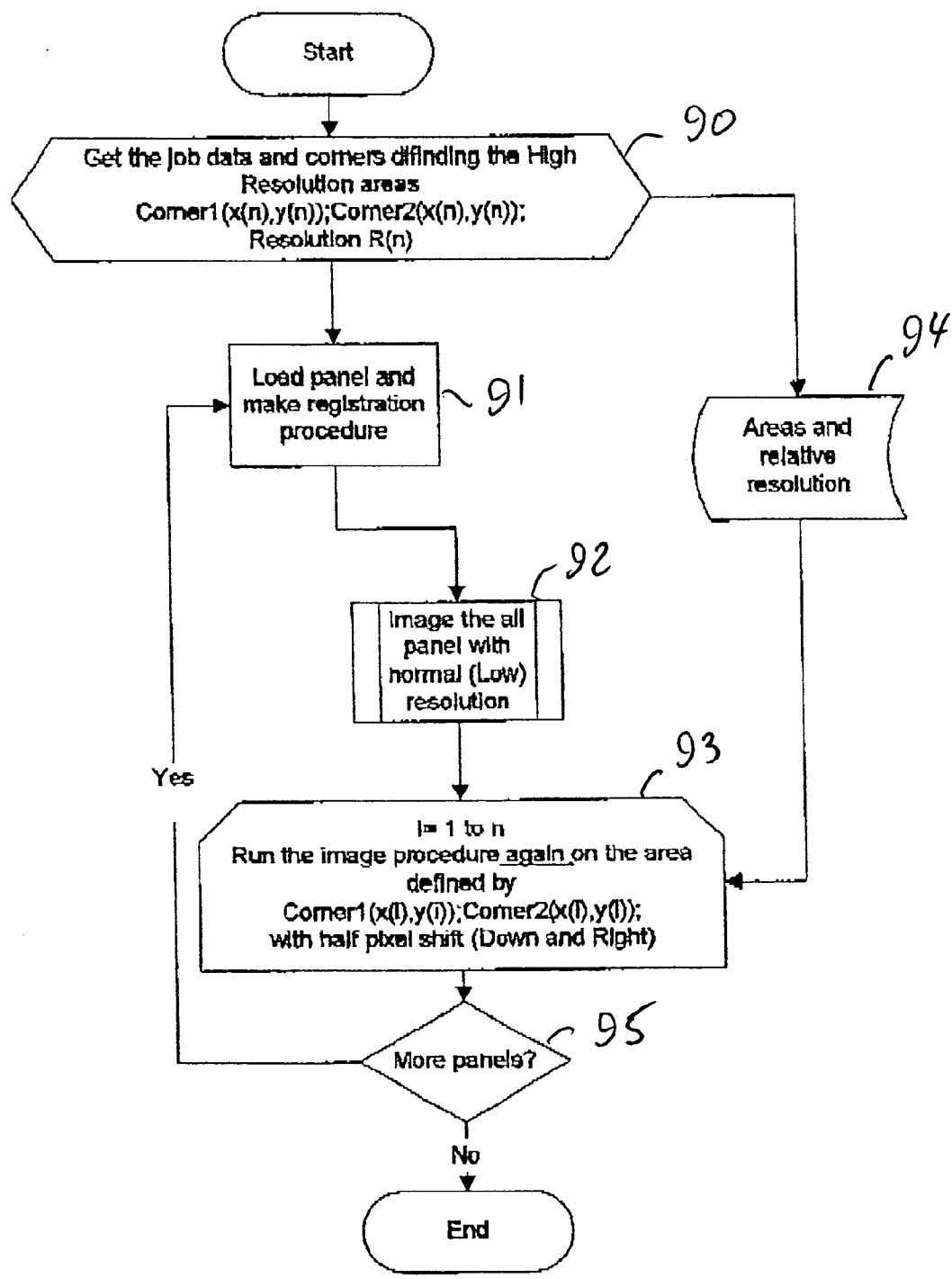
FIG. 9 is a flow chart illustrating a second mode of operation of the system.

FIG. 9 illustrates a multiple-scan process, in which the scanning drive and the exposure head are controlled to cause the exposure head to print both the first and second portions of the pattern at a first resolution during a first scan of the exposure head, and then to print only the second portion of the pattern requiring the high resolution during a second scan of the exposure head. Thus, as shown in FIG. 9, the high-resolution and low-resolution portions of the pattern are predefined (block 90), and the panel is loaded onto the apparatus and properly registered (block 91), as in the flow chart of FIG. 8. In this case, however, the complete pattern is imaged at the normal or low resolution (block 92), and then only the portion or portions of the pattern requiring higher resolution are re-scanned (block 93) according to the specified higher resolution (block 94). The foregoing operations are repeated for all the patterns to be printed on all the panels (block 95).

While the invention has been described with respect to several preferred embodiments, it will be appreciated that these are set forth merely for purposes of example, and that many other variations, modifications and applications of the invention may be made.

What is claimed is:

1. A method of printing a pattern on a substrate, comprising:
    applying a photoresist layer over said substrate;
    locating a laser direct-imaging exposure head with respect to said substrate to print said pattern on the substrate by the application of laser energy to the photoresist layer on the substrate while relative movement is effected between said exposure head and said substrate by a drive;
    defining a first portion of the substrate to be printed with a first portion of the pattern at a first resolution, and a second portion of the substrate to be printed with a second portion of the pattern at a second, higher resolution;
    and controlling said drive and said exposure head to cause the exposure head to print said first portion of the pattern on said first portion of the substrate at said first resolution, and said second portion of the pattern on said second portion of the substrate at said second, higher resolution.

2. The method according to claim 1, wherein said photoresist layer applied over said substrate is a bi-state photoresist material which assumes a non-exposed state up to a predetermined exposure threshold, an exposed state at said predetermined exposure threshold, and remains in said exposed state beyond said predetermined exposure threshold, being insensitive to further exposure beyond said predetermined exposure threshold.

3. The method according to claim 1, wherein said second portion of the substrate to be printed at said second, higher resolution is defined by specifying the borders of said second portion of the pattern, while the remainder of said substrate is defined as said first portion of the substrate to be printed with said first portion of the pattern at said first resolution.

4. The method according to claim 1, wherein said drive and exposure head are controlled such that smaller increments of movement are effected by said drive between said exposure head and said substrate while the exposure head is printing said second portion of the pattern at said second, higher resolution than while the exposure head is printing said first portion of the pattern at said first resolution.

5. The method according to claim 1, wherein said drive and said exposure head are controlled to cause the exposure head to print said first portion of the pattern on said first portion of the substrate at said first resolution, and said second portion of the pattern on said second portion of the substrate at said second, higher resolution, both during a single scan of the exposure head with respect to said substrate.

6. The method according to claim 1, wherein said drive and said exposure head are controlled to cause the exposure head to print said first and second portions of the pattern on said first and second portions of the substrate at said first resolution during a first scan of the exposure head with respect to said substrate; and then to print only said second portion of the pattern on said second portion of the substrate at said second, higher resolution during a second scan of the exposure head with respect to said substrate.

7. The method according to claim 1, wherein said drive includes a first motor and transmission which moves the substrate with respect to the exposure head along the longitudinal axis of the substrate, and a second motor and transmission which moves the exposure head with respect to the substrate along the transverse axis of the substrate; said first motor and transmission being controlled to move the substrate through smaller increments of distance when the exposure head is printing said second portion of the pattern at said second, higher resolution, than when printing said first portion of the pattern at said first resolution.

8. The method according to claim 7, wherein said exposure head includes a linear array of lasers extending in the direction of said longitudinal axis of the substrate, said lasers being selectively controlled to print at said first resolution or said second higher resolution during the transverse movement of the exposure head with respect to the substrate.

9. The method according to claim 7, wherein said exposure head includes a laser producing a laser beam, and a rotating polygonal mirror for reflecting the laser beam in the direction of said longitudinal axis; said laser beam being selectively controlled with respect to said mirror to print at said first resolution or said second, higher resolution during the transverse movement of the exposure head with respect to the substrate.

10. The method according to claim 1, wherein said substrate is a printed circuit board, and said pattern is a conductive pattern in a layer of said printed circuit board.

11. Apparatus for printing a pattern on a photoresist layer carried by a substrate, comprising:
    a holder for carrying said substrate;
    a laser direct-imaging exposure head mounted with respect to said holder to print said pattern on the photoresist layer of the substrate when the substrate is carried by said holder;
    a drive for effecting relative movement between said exposure head and said substrate;
    and a controller programmed to enable:
        defining a first portion of the substrate to be printed with a first portion of the pattern at a first resolution, and a second portion of the substrate to be printed with a second portion of the pattern at a second, higher resolution;

and controlling said drive and said exposure head to cause the exposure head to print said first portion of the pattern on said first portion of the substrate at said first resolution, and said second portion of the pattern on said second portion of the substrate at said second, higher resolution.

12. The apparatus according to claim 11, wherein said drive and exposure head are controlled such that smaller increments of movement are effected by said drive between said exposure head and said substrate while the exposure head is printing said second portion of the pattern on said second portion of the substrate, than while the exposure head is printing said first portion of the pattern on said first portion of the substrate.

13. The apparatus according to claim 11, wherein said drive and said exposure head are controlled to cause the exposure head to print said first portion of the pattern on said first portion of the substrate at said first resolution, and said second portion of the pattern on said second portion of the substrate at said second, higher resolution, both during a single scan of the exposure head with respect to said substrate.

14. The apparatus according to claim 11, wherein said drive and said exposure head are controlled to cause the exposure head to print said first and second portions of the pattern on said first and second portions of the substrate at said first resolution during a first scan of the exposure head with respect to said substrate; and then to print only said second portion of the pattern on said second portion of the substrate at said second, higher resolution during a second scan of the exposure head with respect to said substrate.

15. The apparatus according to claim 11, wherein said drive includes a first motor and transmission which moves the substrate with respect to the exposure head along the longitudinal axis of the substrate, and a second motor and transmission which moves the exposure head with respect to the substrate along the transverse axis of the substrate; said first motor and transmission being controlled to move the substrate through smaller increments of distance when the exposure head is printing said second portion of the pattern at said second, higher resolution, than when printing said first portion of the pattern at said first resolution.

16. The apparatus according to claim 15, wherein said exposure head includes a linear array of lasers extending in the direction of said longitudinal axis of the substrate, said lasers being selectively controlled to print at said first resolution or said second higher resolution during the transverse movement of the exposure head with respect to the substrate.

17. The apparatus according to claim 15, wherein said exposure head includes a laser producing a laser beam, and a rotating polygonal mirror for reflecting the laser beam in the direction of said longitudinal axis; said laser beam being selectively controlled with respect to said mirror to print at said first resolution or said second, higher resolution during the transverse movement of the exposure head with respect to the substrate.

* * * * *